United States Patent
Exposito et al.

(10) Patent No.: US 6,870,238 B2
(45) Date of Patent: Mar. 22, 2005

(54) SHIELDED HOUSING FOR OPTICAL SEMICONDUCTOR COMPONENT

(75) Inventors: Juan Exposito, St. Nazaire les Eymes (FR); Remi Brechignac, Grenoble (FR); Julien Vittu, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/478,177

(22) PCT Filed: May 17, 2002

(86) PCT No.: PCT/FR02/01690

§ 371 (c)(1),
(2), (4) Date: Jun. 14, 2004

(87) PCT Pub. No.: WO02/095837

PCT Pub. Date: Nov. 28, 2002

(65) Prior Publication Data

US 2004/0212055 A1 Oct. 28, 2004

(30) Foreign Application Priority Data

May 18, 2001 (FR) .............................................. 01 06552

(51) Int. Cl.[7] .............................................. H01L 27/14
(52) U.S. Cl. ...................... 257/431; 257/432; 257/433; 257/434; 257/435; 257/680
(58) Field of Search .................................. 257/431, 432, 257/433, 434, 435, 680, 787

(56) References Cited

U.S. PATENT DOCUMENTS

| | | | | |
|---|---|---|---|---|
| 5,650,659 A | * | 7/1997 | Mostafazadeh et al. | 257/660 |
| 6,150,193 A | * | 11/2000 | Glenn | 438/113 |
| 6,303,978 B1 | * | 10/2001 | Daniels et al. | 257/642 |

* cited by examiner

*Primary Examiner*—Roy Potter
(74) *Attorney, Agent, or Firm*—Lisa K. Jorgenson; Jose Gutman; Fleit, Kain, Gibbons, Gutman, Bongini & Bianco P.L.

(57) ABSTRACT

An optical semiconductor package includes an optical semiconductor component (8), a front face of which has an optical sensor (10), and encapsulation defining a cavity in which the optical component is placed and having external electrical connection (11) of this optical semiconductor component (8). The encapsulation (2, 5) includes a glass pane letting light through to the optical sensor. The encapsulation (2, 5) includes electromagnetic screening (23, 24, 28) made of an electrically conductive material, that is externally connectable, this screening being electrically isolated in the optical semiconductor package from the electrical connection of the optical semiconductor component (8).

27 Claims, 3 Drawing Sheets

SHIELDED HOUSING FOR OPTICAL SEMICONDUCTOR COMPONENT

CROSS-REFERENCE TO RELATED APPLICATIONS

This application is the National Stage of International Application No. PCT/FR02/01690 filed on May 17, 2002, which is based upon and claims priority from prior French Patent Application No. 0106552 filed May 18, 2001, the entire disclosure of which is herein incorporated by reference.

BACKGROUND OF THE INVENTION

1. Field of the Invention

The present invention relates to the field of optical semiconductor packages.

2. Description of Related Art

In the prior art, such packages comprise a sealed cavity in which an optical semiconductor component, one front face of which has an optical sensor, is fastened, the cavity being partly defined by a glass pane lying in front of this optical sensor. It is furthermore known to fasten, outside the cavity and to the glass pane, a lens holder provided with a lens placed so as to face the optical sensor.

Since optical semiconductor components are sensitive to electromagnetic fields, such packages deliver electrical signals that are perturbed by such fields.

SUMMARY OF THE INVENTION

It is an object of the present invention to provide an optical semiconductor package which improves the quality of the electrical signals that it has to deliver.

In general, the optical semiconductor package according to the invention comprises an optical semiconductor component, a front face of which has an optical sensor, and encapsulation means defining a cavity in which said optical component is placed and having means for the external electrical connection of this optical semiconductor component, said encapsulation means including a glass pane letting light through to said optical sensor.

According to the invention, said encapsulation means comprise electromagnetic shielding means made of an electrically conductive material, which is externally connectable, these shielding means being electrically isolated from the means for the electrical connection of said optical component, a region of said encapsulation means facing said optical sensor being free of electromagnetic shielding means so that light is let through to said sensor.

According to the invention, said shielding means are preferably at least partly integrated into said encapsulation means.

According to the invention, advantageously said shielding means may at least partly envelop said encapsulation means.

According to a variant of the invention, said encapsulation means comprise a support and a glazed lid placed over a front face of this support, which between them define said cavity, said optical component being fastened to this support and the latter having a leadframe for the external electrical connection of this optical component.

According to the invention, said shielding means preferably comprise shielding parts carried by said support and shielding parts carried by said glazed lid, these shielding parts being electrically connected together in the region of the front face of said support.

According to the invention, said glazed lid is preferably fastened to said support by an electrically conductive adhesive making the electrical connection between them.

According to the invention, said glazed lid may advantageously comprise a glass pane, one face of which is at least partly covered with a shielding layer or plate made of an electrically conductive material, leaving an opening facing said optical sensor.

According to the invention, said glazed lid may advantageously comprise a plate made of an electrically conductive material, which has an opening facing said optical sensor and is obstructed by said glass pane.

According to another variant of the invention, said encapsulation means comprise a support, a glazed lid placed over a front face of this support, which between them define said cavity, and a lens holder placed in front of said glazed lid, said optical component being fastened to this support and the latter having a leadframe for the external electrical connection of this optical component.

According to the invention, said shielding means preferably comprise shielding parts carried by said support and shielding parts carried by said lens holder, these shielding parts being electrically connected together in the region of said front face of said support.

According to the invention, said lens holder is preferably fastened to said support by an electrically conductive adhesive making the electrical connection between them.

According to the invention, said lens holder is preferably provided with an outer envelope or layer made of an electrically conductive material constituting its shielding part.

According to the invention, said shielding parts carried by said support preferably comprise at least one integrated shielding plane extending beneath said optical component and integrated columns emerging on the front face of said support.

BRIEF DESCRIPTION OF THE DRAWINGS

The present invention will be more clearly understood on examining the optical semiconductor packages described by way of non-limiting examples and illustrated by the drawing in which.

DETAILED DESCRIPTION OF PREFERRED EMBODIMENTS

Figure 1:
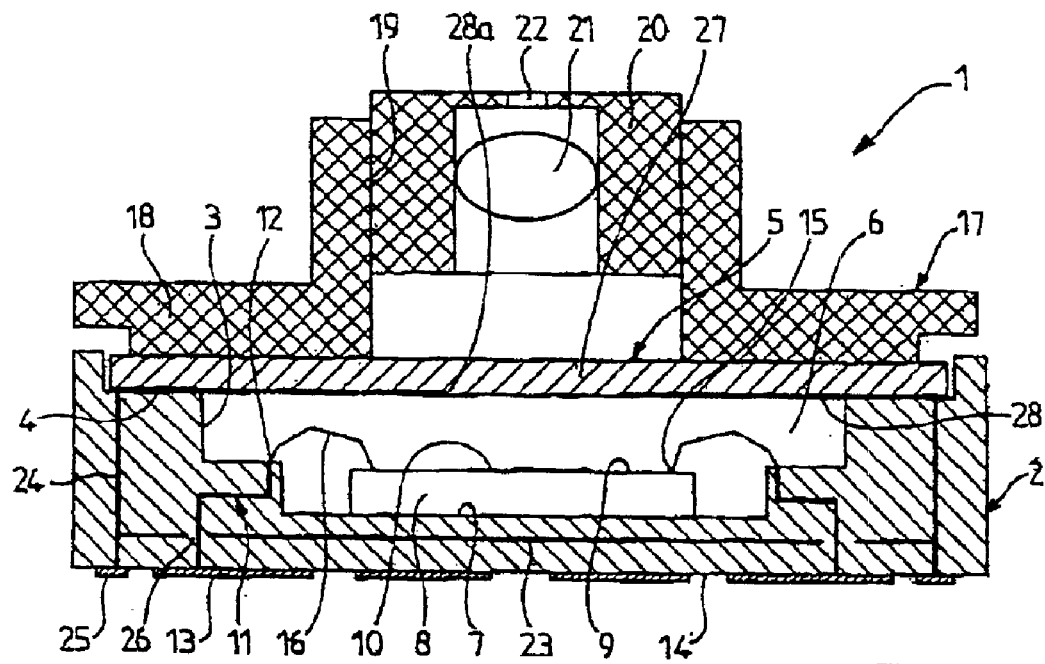
FIG. 1 shows a section through a first optical semiconductor package according to the present invention.
Figure 2:
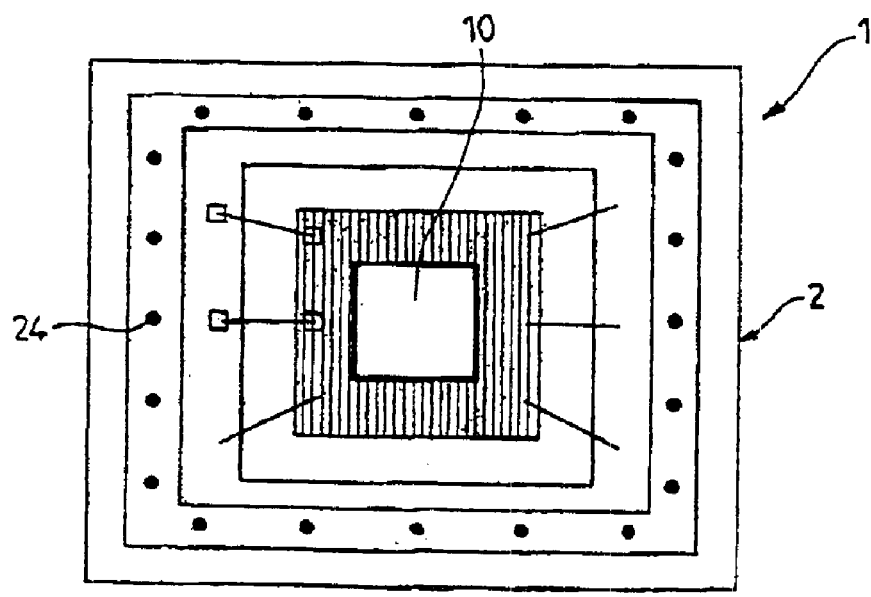
FIG. 2 shows a top view, with the lens holder and glass pane removed, of the optical semiconductor package of FIG. 1.
Figure 3:
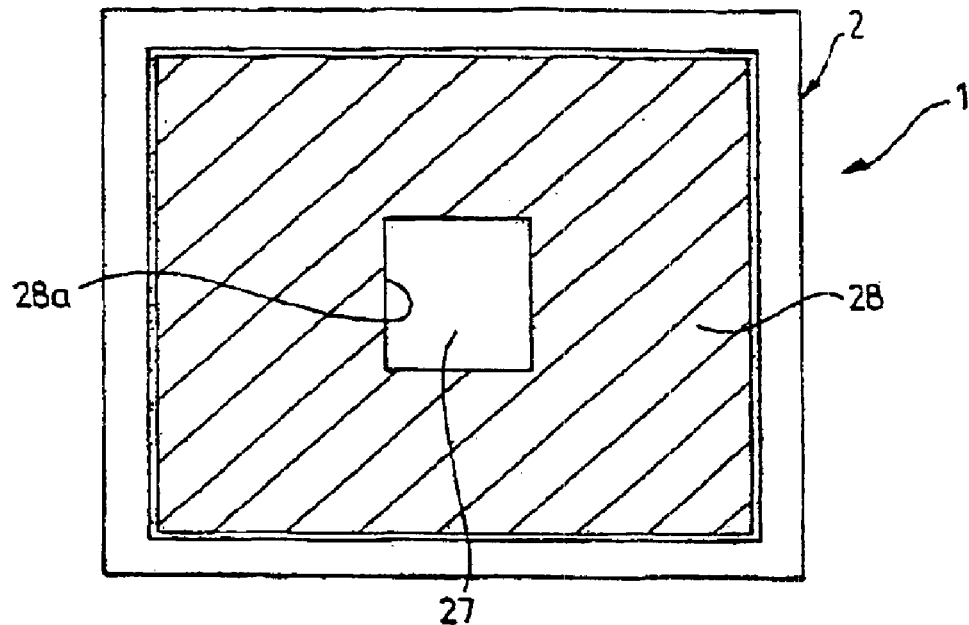
FIG. 3 shows a top view, with the lens holder removed, of the optical semiconductor package of FIG. 1.

Referring to FIGS. 1 to 3, these show an optical semiconductor package 1 which comprises a flat support 2 of parallelepidedal shape in one face of which a recessed hollow 3 is made in such a way that this support 2 has, around this recess, an annular front face 4.

This optical package 1 includes a glazed lid 5, the periphery of the rear face of which bears against and is fastened to the front face 4 of the support 2, for example by means of an adhesive. Thus, the support 2 and the glazed lid 5 define a sealed encapsulation cavity 6.

An optical semiconductor component 8 is placed in the cavity 6. The rear face of the optical component 8 is fastened, for example by an adhesive, to the bottom 7 of the recess 3 and its front face 9, which lies at a certain distance from and parallel to the glazed lid 5, has, in its central part, an optical sensor 10 covering, for example, a square region.

The support 2, consisting for example of a multilayer ceramic or organic material, has an internal leadframe 11 for electrical interconnections. This leadframe 11 connects internal pads 12 placed on and distributed over the wall of the recess 3 of the support 2, at a certain distance from and at the periphery of the optical component 8, to external pads 13 for external electrical connection which are placed on and distributed over the rear face 14 of the support 2.

The optical component 8 has, on its front face 9, at a short distance from its periphery and at a certain distance from the optical sensor 10, front electrical connection pads 15.

The internal pads 12 of the support 2 and the front pads 15 of the optical component 9 are connected by electrical wires 16, the ends of which are bonded to these pads. The optical component 8 may thus be connected to an external electrical member through the support 2, via the leadframe 11 and the electrical wires 16.

The optical package 1 furthermore includes a lens holder 17, external to the cavity 6, which comprises an annular plate 18 fastened, for example by adhesive bonding, to the front face of the glazed lid 5. A bush 20 is mounted in the central opening 19 of the plate 18 by means of an internal thread, this bush carrying, in its passage, an optical lens 21 placed so as to face the optical sensor 10. The front part of the washer 20 defines a diaphragm 22.

Thus, the external light passes through the diaphragm 22, the lens 21 and the glass pane 27, and through the opening 28a, before reaching the optical sensor 10 of the optical component 8.

The optical package 1 furthermore includes electromagnetic shielding means which are electrically isolated from the electrical connection leadframe 11 of the support 2 and are made in the following way.

The support 2 comprises an integrated plane 23 made of an electrically conductive material, for example a metal, which lies parallel to its rear face 14, and a multiplicity of integrated columns 24 made of an electrically conductive material, for example a metal, which are distributed within the peripheral volume of the support 2 and are connected to the conducting plane 23. These conducting columns 24 emerge on the front face 4 of the support 2 and at least one of these columns emerges on the rear face 14 of the support 2 so as to constitute at least one external electrical connection pad 25.

In the support 2, the integrated conducting plane 23 and the integrated conducting columns 24 are arranged so as not to be in contact with the integrated interconnection leadframe 11. In particular, the conducting plane 23 has through-passages 26 through which the interconnection lines of the leadframe 11 pass.

The glazed lid 5 comprises a transparent glass panel 27, the rear face of which is provided with a layer 28 made of an electrically contacting material, except in its central part facing the optical sensor 10 of the optical component 8 so as to leave a passage 28 for the light.

On the rear face of the glazed lid 5 is fastened by means of an annular electrically conductive adhesive to the front face 4 of the support 1 in such a way that the conducting layer 28 is electrically connected to the integrated conducting columns 24, the plate 18 of the lens holder 17 being fastened by adhesive bonding to the front face of the glass pane 27.

It follows from the foregoing that, by connecting the external pad 25 to an earth, preferably independent of the earth of the optical component, the shielding means consisting of the conducting plane 23, the conducting columns 24 and the conducting layer 28 constitute a cage for electromagnetically isolating the optical semiconductor component 8.

Figure 4:
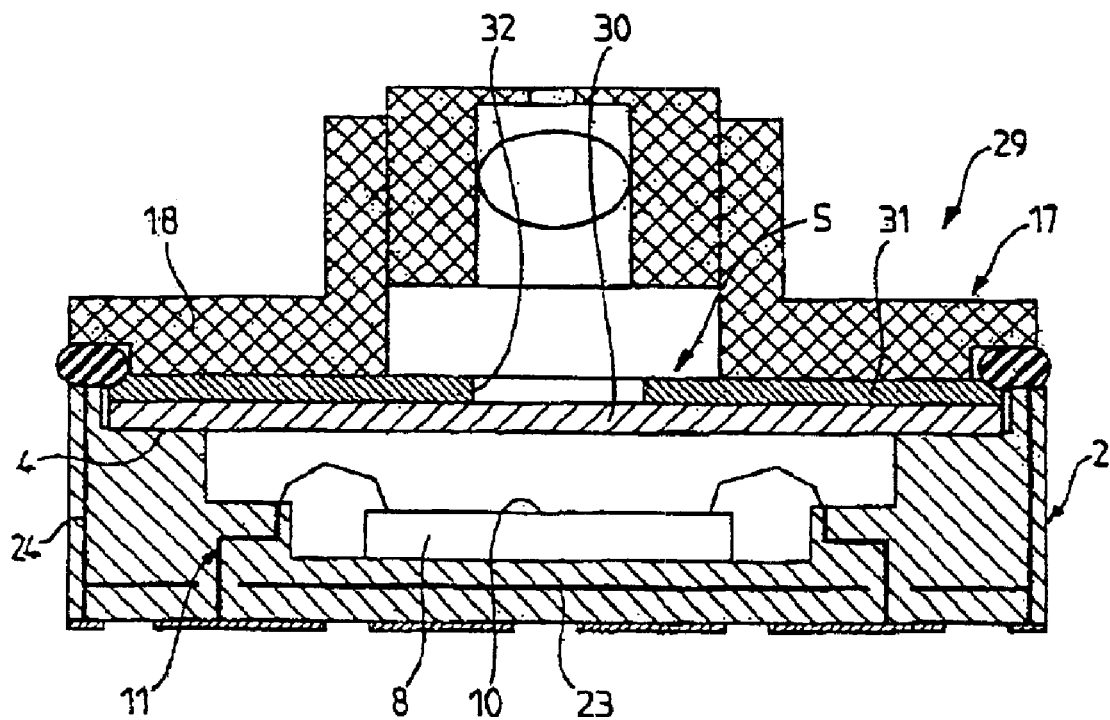
FIG. 4 shows a section through a second optical semiconductor package according to the present invention.

Referring to FIG. 4, this shows an optical semiconductor package 29 which differs from the optical semiconductor package 1 in the following way.

Its glazed lid 5 comprises a transparent glass pane 30, the periphery of which bears on the front face 4 of the support 2, and a plate 31 or layer made of an electrically conductive material placed between the front face of the glass pane 30 and the rear face of the lens holder 17 and having an opening or passage 32 facing the optical sensor 10 of the optical component 8.

The conducting columns 24 of the support 2 emerge beneath the peripheral part of the plate 18 of the lens holder 17, peripherally with respect to the glazed lid 5. The lens holder 17 is fastened to the support 2 by means of an annular electrically conductive adhesive which furthermore provides an electrical connection between the conducting layer or plate 31 and the integrated conducting columns 24.

In this example, the conducting plane 23, the conducting columns 24 and the conducting layer or plate 31 constitute a cage for electromagnetically isolating the optical semiconductor component 8.

Figure 5:
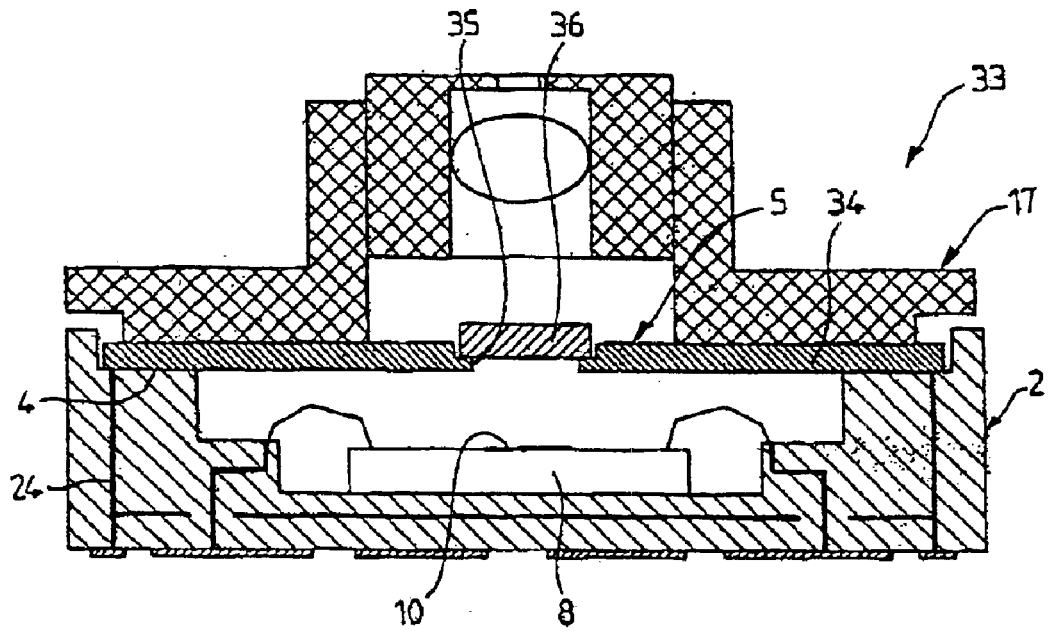
FIG. 5 shows a third optical semiconductor package according to the present invention.

Referring to FIG. 5, this shows an optical semiconductor package 33 which differs from the optical package 1 described with reference to FIGS. 1 to 3 in the following way.

The glazed lid 5 comprises a plate 34 made of an electrically conductive material, the peripheral part of the rear face of which is fastened, by an annular electrically conductive adhesive, to the front face 4 of the support 2 so as to be electrically connected to the integrated conducting columns 24 of this support 2.

The conducting plate 34 has an opening or passage 35 obstructed by a transparent glass pane 36 facing the optical sensor 10 of the optical component 8.

The lens holder 17 is fastened by means of an adhesive to the front face of the conducting plate 34.

In this example, the integrated conducting plane 23, the conducting columns 24 and the conducting plate 34 constitute a cage for electromagnetically isolating the optical component 8.

Figure 6:
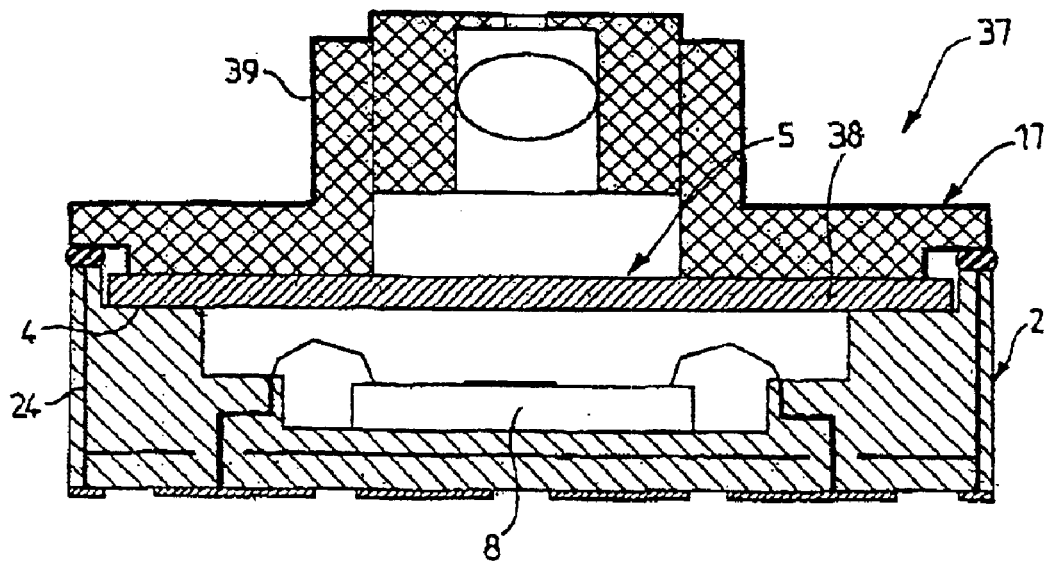
FIG. 6 shows a fourth optical semiconductor package according to the present invention.

Referring to FIG. 6, this shows an optical semiconductor package 37 which differs from the optical semiconductor package 29 described with reference to FIG. 4 in the following way.

The glazed lid 5 comprises only a transparent glass pane 38 interposed between the rear face of the lens holder 17 and the front face 4 of the support 2.

The external faces of this lens holder 17 are covered with a layer 39 made of an electrically conductive material, which is electrically connected to the integrated conducting columns 24 of the support 2 by means of the annular electrically conductive adhesive fastening the support 2 to the lens holder 17.

In this example, the integrated conducting plane 23, the integrated conducting columns 24 and the conducting layer 39 constitute a cage for electromagnetically isolating the semiconductor component 8.

The present invention is not limited to the examples described above. Many alternative embodiments are possible without departing from the scope defined by the appended claims.

What is claimed is:

1. An optical semiconductor package comprising an optical semiconductor component, a front face of which has an optical sensor, and encapsulation means defining a cavity in which the optical component is placed and having means for the external electrical connection of this optical semiconductor component, the encapsulation means including a glass pane letting light through to the optical sensor, wherein the encapsulation means comprises electromagnetic screening means made of an electrically conductive material, which is externally connectable, the screening means being electrically isolated from the means for the electrical connection of the optical component.

2. The optical semiconductor package according to claim 1, wherein the screening means is at least partly integrated into the encapsulation means.

3. The optical semiconductor package according to claim 2, wherein the encapsulation means comprises a support, a glazed lid placed over a front face of this support, which between them define the cavity, and a lens holder placed in front of the glazed lid, the optical component being fastened to this support and the latter having a leadframe for the external electrical connection of this optical component, wherein the screening means comprise screening parts carried by the support and screening parts carried by the lens holder, these screening parts being electrically connected together in the region of the front face of the support.

4. The optical semiconductor package according to claim 3, wherein the lens holder is fastened to the support by an electrically conductive adhesive making the electrical connection between them.

5. The optical semiconductor package according to claim 3, wherein the lens holder is provided with an outer envelope or layer made of an electrically conductive material constituting its screening part.

6. The optical semiconductor package according to claim 1, wherein the screening means at least partly envelops the encapsulation means.

7. The optical semiconductor package according to claim 1, wherein the encapsulation means comprises a support and a glazed lid placed over a front face of the support, which between them define the cavity, the optical component being fastened to this support and the latter having a leadframe for the external electrical connection of this optical component, wherein the screening means comprises screening parts carried by the support and screening parts carried by the glazed lid, these screening parts being electrically connected together in the region of the front face of the support.

8. The optical semiconductor package according to claim 7, wherein the screening parts carried by the support comprise at least one integrated screening plane extending beneath the optical component and integrated columns emerging on the front face of the support.

9. The optical semiconductor package according to claim 7, wherein the glazed lid comprises a glass pane, one face of which is at least partly covered with a screening layer or plate made of an electrically conductive material, leaving an opening facing the optical sensor.

10. The optical semiconductor package according to claim 7, wherein the glazed lid comprises a plate made of an electrically conductive material, which has an opening facing the optical sensor and is obstructed by the glass pane.

11. The optical semiconductor package according to claim 7, wherein the glazed lid is fastened to the support by an electrically conductive adhesive making the electrical connection between them.

12. The optical semiconductor package according to claim 11, wherein the glazed lid comprises a glass pane, one face of which is at least partly covered with a screening layer or plate made of an electrically conductive material, leaving an opening facing the optical sensor.

13. The optical semiconductor package according to claim 11, wherein the glazed lid comprises a plate made of an electrically conductive material, which has an opening facing the optical sensor and is obstructed by the glass pane.

14. The optical semiconductor package according to claim 1, wherein the encapsulation means comprises a support, a glazed lid placed over a front face of this support, which between them define the cavity, and a lens holder placed in front of the glazed lid, the optical component being fastened to this support and the latter having a leadframe for the external electrical connection of this optical component, wherein the screening means comprises screening parts carried by the support and screening parts carried by the lens holder, these screening parts being electrically connected together in the region of the front face of the support.

15. The optical semiconductor package according to claim 14, wherein the lens holder is fastened to the support by an electrically conductive adhesive making the electrical connection between them.

16. The optical semiconductor package according to claim 14, wherein the lens holder is provided with an outer envelope or layer made of an electrically conductive material constituting its screening part.

17. An electronic device comprising:
an electronic circuit; and
an optical semiconductor package, electrically coupled to the electronic circuit, the optical semiconductor package comprising:
an optical semiconductor component, a front face of which has an optical sensor, and encapsulation means defining a cavity in which the optical component is placed and having means for the external electrical connection of the optical semiconductor component, the encapsulation means including a glass pane letting light through to the optical sensor, wherein the encapsulation means comprise electromagnetic screening means made of an electrically conductive material, which is externally connectable, the screening means being electrically isolated in the optical semiconductor package from the means for the external electrical connection of the optical component.

18. The electronic device of claim 17, wherein the screening means is at least partly integrated into the encapsulation means.

19. The electronic device of claim 18, wherein the encapsulation means comprises a support, a glazed lid placed over a front face of this support, which between them define the cavity, and a lens holder placed in front of the glazed lid, the optical component being fastened to this support and the latter having a leadframe for the external electrical connection of this optical component, wherein the screening means comprises screening parts carried by the support and screening parts carried by the lens holder, these screening parts being electrically connected together in the region of the front face of the support.

20. The electronic device of claim 19, wherein the lens holder is fastened to the support by an electrically conductive adhesive making the electrical connection between them.

21. The electronic device of claim 19, wherein the lens holder is provided with an outer envelope or layer made of an electrically conductive material constituting its screening part.

22. The electronic device of claim 17, wherein the encapsulation means comprises a support and a glazed lid placed over a front face of the support, which between them define the cavity, the optical component being fastened to this support and the latter having a leadframe for the external electrical connection of this optical component, wherein the screening means comprises screening parts carried by the support and screening parts carried by the glazed lid, these screening parts being electrically connected together in the region of the front face of the support.

23. The electronic device of claim 22, wherein the screening parts carried by the support comprise at least one integrated screening plane extending beneath the optical component and integrated columns emerging on the front face of the support.

24. The electronic device of claim 22, wherein the glazed lid comprises a glass pane, one face of which is at least partly covered with a screening layer or plate made of an electrically conductive material, leaving an opening facing the optical sensor.

25. The electronic device of claim 22, wherein the glazed lid comprises a plate made of an electrically conductive material, which has an opening facing the optical sensor and is obstructed by the glass pane.

26. The electronic device of claim 22, wherein the glazed lid is fastened to the support by an electrically conductive adhesive making the electrical connection between them.

27. The electronic device of claim 26, wherein the glazed lid comprises a glass pane, one face of which is at least partly covered with a screening layer or plate made of an electrically conductive material, leaving an opening facing the optical sensor.

* * * * *